US012775055B2

(12) United States Patent
Strelkov et al.

(10) Patent No.: US 12,775,055 B2
(45) Date of Patent: Oct. 27, 2026

(54) MAGNETORESISTIVE ELEMENT FOR SENSING A MAGNETIC FIELD IN AN OUT-OF-PLANE DIRECTION WITH INCREASED SENSITIVITY

(71) Applicant: Allegro MicroSystems, LLC, Manchester, NH (US)

(72) Inventors: Nikita Strelkov, Meylan (FR); Andrey Timopheev, Vif (FR); Salim Dounia, Grenoble (FR); Clarisse Ducruet, Chambéry (FR)

(73) Assignee: Allegro MicroSystems, LLC, Manchester, NH (US)

( * ) Notice: Subject to any disclaimer, the term of this patent is extended or adjusted under 35 U.S.C. 154(b) by 226 days.

(21) Appl. No.: 18/754,785

(22) Filed: Jun. 26, 2024

(65) Prior Publication Data

US 2026/0003017 A1 Jan. 1, 2026

(51) Int. Cl.
*G01R 33/09* (2006.01)

(52) U.S. Cl.
CPC ......... *G01R 33/098* (2013.01); *G01R 33/093* (2013.01); *G01R 33/095* (2013.01); *G01R 33/096* (2013.01)

(58) Field of Classification Search
CPC .... G01R 33/09; G01R 33/093; G01R 33/095; G01R 33/096; G01R 33/098
See application file for complete search history.

(56) References Cited

U.S. PATENT DOCUMENTS 9,841,266 B2 12/2017 Lombard et al.
2012/0299134 A1* 11/2012 Jan ........................ H10N 50/01 257/E29.323

(Continued)

FOREIGN PATENT DOCUMENTS

EP 4 130 772 A1 2/2023
EP 4 198 541 A1 6/2023

(Continued)

OTHER PUBLICATIONS

U.S. Appl. No. 18/256,494, filed Jun. 8, 2023, Childress et al.
U.S. Appl. No. 18/333,680, filed Jun. 13, 2023, Jaiswal.
U.S. Appl. No. 18/333,765, filed Jun. 13, 2023, Campiglio et al.
U.S. Appl. No. 18/470,538, filed Sep. 20, 2023, Solignac et al.
U.S. Appl. No. 18/511,743, filed Nov. 16, 2023, Campiglio et al.

(Continued)

*Primary Examiner* — Douglas X Rodriguez
*Assistant Examiner* — Kendrick X Liu
(74) *Attorney, Agent, or Firm* — DALY, CROWLEY, MOFFORD & DURKEE, LLP

(57) ABSTRACT

The present disclosure concerns a magnetoresistive sensor (MR) element, comprising a reference layer having a reference magnetization; a sense layer having a sense magnetization comprising a vortex configuration stable under the presence of an external magnetic field, the sense magnetization being reversibly movable in a direction out-of-plane relative to the reference magnetization when the external magnetic field varies in a direction out-of-plane; and a tunnel barrier layer between the reference layer and the sense layer. The MR element further comprises a dipolar assisting layer, configured to generate a dipolar stray field oriented substantially out-of-plane, such that the dipolar stray field is added to the out-of-plane external magnetic field, resulting in an effective magnetic field that is larger than and proportional to the external magnetic field. The present disclosure further concerns a magnetic sensor device comprising the MR element.

20 Claims, 6 Drawing Sheets

(56) References Cited

U.S. PATENT DOCUMENTS

| | | | | |
|---|---|---|---|---|
| 2016/0190436 | A1* | 6/2016 | Hu | G11C 11/161<br>438/3 |
| 2017/0168122 | A1 | 6/2017 | Raberg et al. | |
| 2024/0345182 | A1 | 10/2024 | Timopheev et al. | |
| 2025/0231259 | A1* | 7/2025 | Palomino | G01R 33/096 |

FOREIGN PATENT DOCUMENTS

| | | | |
|---|---|---|---|
| EP | 4 231 031 | A1 | 8/2023 |
| EP | 4 257 998 | A1 | 10/2023 |

OTHER PUBLICATIONS

U.S. Appl. No. 18/628,319, filed Apr. 5, 2024, Lehndorff et al.
U.S. Appl. No. 18/679,972, filed May 31, 2024, Ducruet.
U.S. Appl. No. 18/709,631, filed May 13, 2024, Strelkov et al.
U.S. Appl. No. 18/740,749, filed Jun. 12, 2024, Dounia et al.
U.S. Appl. No. 18/915,521, filed Oct. 15, 2024, Campiglio et al.
Dussaux et al., "Large Amplitude Spin Torque Vortex Oscillations at Zero External Field Using a Perpendicular Spin Polarizer;" Applied Physics Letters, vol. 105, 022404; Published Online Jul. 14, 2014; 4 Pages.
Pan et al., "Skyrmion-Induced Memristive Magnetic Tunnel Junction for Ternary Neural Network;" Journal of the Electron Devices Society, vol. 7; Published Apr. 26, 2019; 5 Pages.
PCT International Search Report and Written Opinion dated Jul. 22, 2025 for International Application No. PCT/US2025/015357; 14 Pages.

* cited by examiner

MAGNETORESISTIVE ELEMENT FOR SENSING A MAGNETIC FIELD IN AN OUT-OF-PLANE DIRECTION WITH INCREASED SENSITIVITY

FIELD

The present disclosure concerns a magnetoresistive element for sensing an external magnetic field in an out-of-plane direction and having an increased sensitivity. The present disclosure further concerns a magnetic sensor device comprising the magnetoresistive element.

BACKGROUND

As illustrated in FIG. 1, a magnetoresistive (MR) element 20 typically comprises a reference layer 21 having a reference magnetization 210 and a sense layer 23 having a free sense magnetization 230. A tunnel barrier layer 22 is sandwiched between the reference layer 21 and the sense layer 23. The MR element 20 can be configured to sense an out-of-plane component of an external magnetic field, substantially perpendicular to the plane of the sense layer. Such MR element is often referred to as an out-of-plane magnetic sensor or a Z-axis sensing magnetic sensor.

The free sense magnetization 230 can comprise a vortex configuration. The vortex configuration is substantially parallel to the plane of the sense layer and has a vortex core magnetization that is reversibly movable in accordance with an external magnetic field in an out-of-plane direction. The vortex configuration provides a linear and non-hysteretic (until the polarity of the vortex core changes) behavior in a large magnitude range of the external magnetic field, for practical size of the MR element and thickness of the sense layer. The MR element typically further comprises an interface layer 24, comprising or made of CoFeB, between the tunnel barrier layer 22 and the sense layer 23. The interface layer 24 allows for obtaining a high TMR of the MR element (TMR ratio equal or above than 100%).

An important aspect of the MR element is to sense the external magnetic field 60 with high out-of-plane sensitivity. The out-of-plane sensitivity can be adjusted by selecting the thickness of the sense layer, the magnetization saturation of the sense layer, and the tunnel magnetoresistance (TMR) of the MR element. For example, the out-of-plane sensitivity can be increased by increasing the TMR of the MR element, increasing the sense layer thickness, and decreasing the magnetization saturation of the sense layer.

There is however little room for further increase in TMR. Increasing of sense layer thickness or decreasing the diameter of the MR element may not result to a significant increase of sensitivity and may also complicate the fabrication process of the MR element. Decreasing the magnetization saturation of the sense layer can be achieved by dilution of the sense layer material. However, this can lead to significant degradation of the magnetic and temperature stability of the sense layer. Moreover, decreasing the saturation magnetization of the sense layer is limited by the exchange spring effect which leads to different sensitivity to the magnetic field 60 of different portions of the sense layer 23 and the interface layer 24 due to reduced exchange stiffness.

The exchange spring effect is enhanced due to the increased demagnetization field at the sides of the sense layer 23. In other words, the out-of-plane sensitivity of the MR element 20 is reduced by the demagnetization field at the top and bottom sides of the sense layer 23 (the side of the tunnel barrier layer 22 and the opposite side of the sense layer 23) due to partial suppression of the external field 60 by the demagnetization field.

FIG. 2 illustrates a simulation of the demagnetization factor within the sense layer 23. The simulation was performed for a cylindrical sense layer 23 having a thickness (z) of 130 nm and a lateral size (x) of 250 nm. FIG. 2 shows that the external magnetic field is more strongly suppressed at the top and bottom sides of the sense layer 23, i.e., on the side of the tunnel barrier layer 22 (z=0 nm) and the opposite side of the sense layer 23 (z=130 nm). The darker the shade the stronger the suppression of the external magnetic field. The conductance of the MR element 20 depends on the relative orientation of magnetizations in thin layers adjacent to the barrier 22, which are parts of the reference layer 21 and the sense layer 23. Since the demagnetizing field reduces significantly the magnetic sensitivity on the surface of the sense layer 23, the overall sensitivity S of the MR element 20 can be also greatly reduced.

FIG. 3 compare out-of-plane sensitivity in the volume of the sense layer 23 (bulk out-of-plane sensitivity, curve A) to the out-of-plane sensitivity at the surface of the sense layer 23 (surface out-of-plane sensitivity, curve B), in the presence of the interface layer 24, as a function of the thickness of the sense layer 23. The bulk out-of-plane sensitivity is larger than the surface out-of-plane sensitivity due to a stray field effect at the bottom side of the sense layer 23.

FIG. 4 reports the out-of-plane sensitivity distribution inside the sense layer 23 in the presence of the interface layer 24 as a function of the coordinate z across the sense layer 23 and for the sense layer 23 having a perpendicular magnetic anisotropy of 0 $J/m^2$ (curve A), 0.25 $10^{-3}$ $J/m^2$ (curve B) and 0.55 $10^{-3}$ $J/m^2$ (curve C). The sense layer 23 is made of diluted NiFe with tantalum (Ta) to reduce its magnetization and has a thickness of 80 nm. The interface layer 24 is made of CoFeB and has a thickness of 2 nm and a magnetization that is larger than the sense magnetization 230. FIG. 4 shows that increasing the perpendicular magnetic anisotropy results in a small increase of the out-of-plane sensitivity.

FIG. 5 compares the of surface out-of-plane sensitivity of the sense layer 23 without the interface layer 24 (curve A) and in the presence of the interface layer 24 (curve B) as a function of the thickness of the sense layer 23. FIG. 5 shows that the presence of the CoFeB containing interface layer 24 leads to a significant decrease in the out-of-plane sensitivity of the MR element 20 due to the exchange spring effect.

SUMMARY

The present disclosure concerns a magnetoresistive sensor (MR) element comprising a reference layer having a reference magnetization; a sense layer having a sense magnetization comprising a vortex configuration stable under the presence of an external magnetic field, the sense magnetization being reversibly movable in a direction out-of-plane relative to the reference magnetization when the external magnetic field varies in a direction out-of-plane; and a tunnel barrier layer between the reference layer and the sense layer. The MR element further comprises a dipolar assisting layer, configured to generate a dipolar stray field oriented substantially out-of-plane, such that the dipolar stray field is added to the out-of-plane external magnetic field resulting in an effective magnetic field that is larger than and proportional to the external magnetic field.

The present disclosure further concerns a magnetic sensor device comprising the MR element.

The MR element disclosed herein allows for increasing the out-of-plane sensitivity of the MR element without increasing the thickness of the sense layer. The increase in the out-of-plane sensitivity of the MR element can reaches up to 50% relative to the out-of-plane sensitivity of a MR element without the dipolar assisting layer.

BRIEF DESCRIPTION

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIG. 1 shows a conventional MR comprising a reference layer, a sense layer, a tunnel barrier layer, and an interface layer.

FIG. 2 reports a simulation of a demagnetizing field of the sense magnetization in the sense layer.

FIG. 3 compares the bulk and surface out-of-plane sensitivity and the sense layer in the presence of the interface layer, as a function of the thickness of the sense layer.

FIG. 4 reports the out-of-plane sensitivity distribution inside the sense layer in the presence of the interface layer as a function of the coordinate z across the sense layer for different values of the perpendicular magnetic anisotropy of the sense layer.

FIG. 5 compares the of surface out-of-plane sensitivity of the sense layer without and in the presence of the interface layer.

Figure 7:
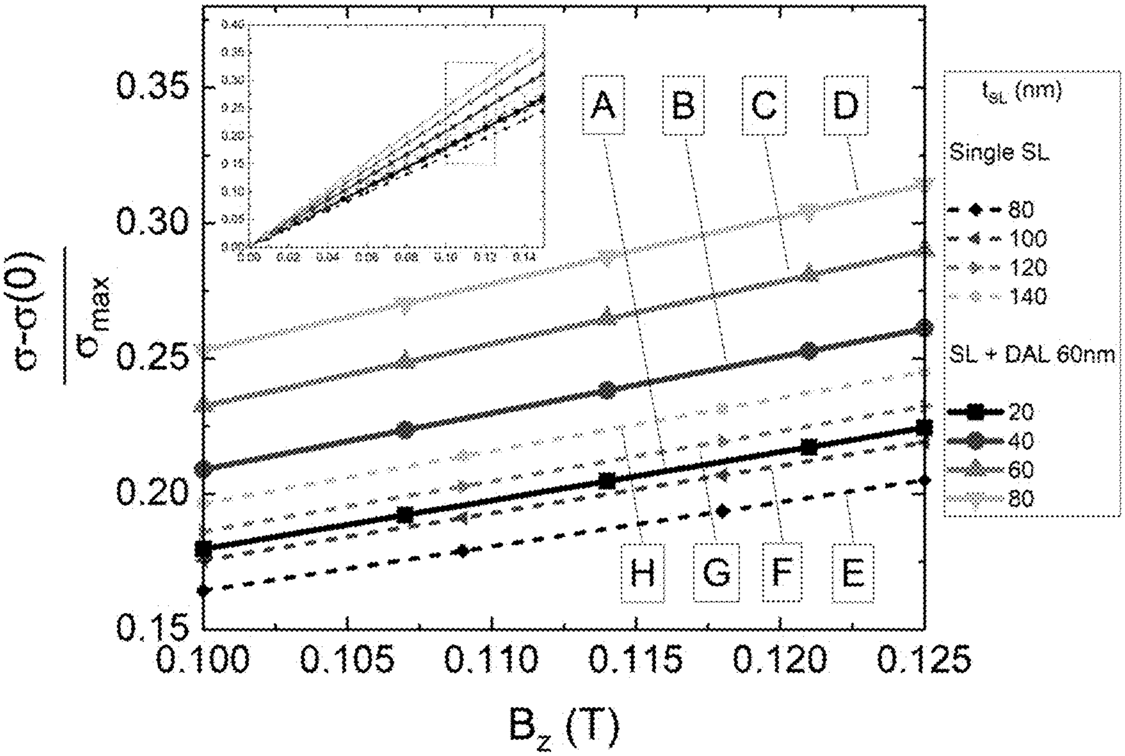
Figure 8:
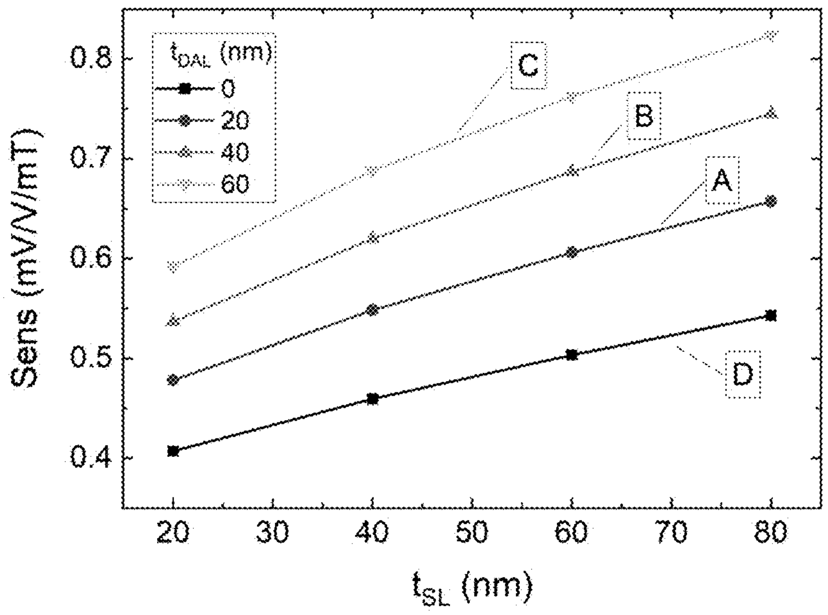
Figure 9:
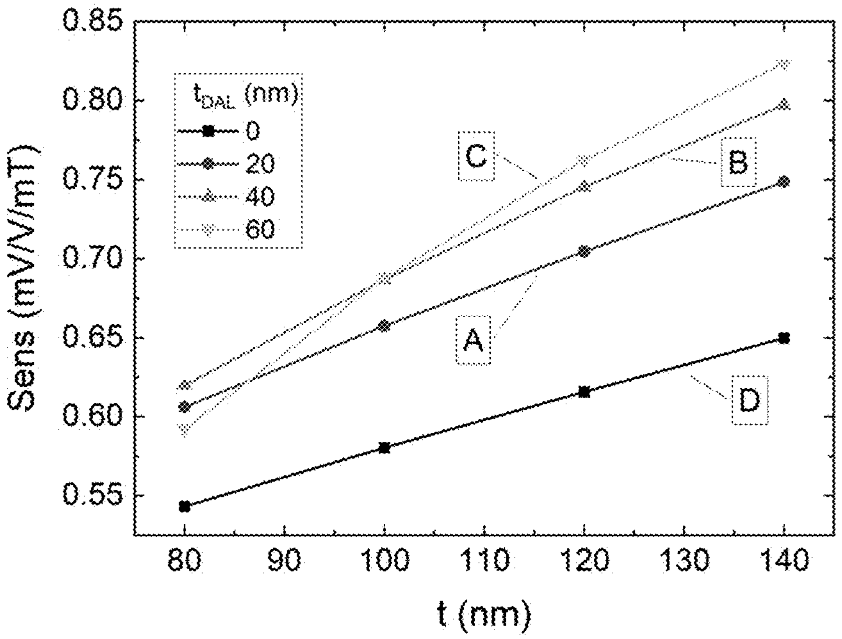

FIG. 7 compares the normalized relative conductance of the MR element comprising the dipolar assisting layer (curves A-D) and without the dipolar assisting layer (curves E-H) as a function of the external magnetic field and for different thicknesses of the sense layer;

FIG. 8 reports the out-of-plane sensitivity of the MR element as a function of the thickness of the sense layer, for different thicknesses of the dipolar assisting layer; and FIG. 9 reports the out-of-plane sensitivity of the MR element as a function of the total thickness of the sense layer and the dipolar assisting layer, for different thicknesses of the dipolar assisting layer.

DETAILED DESCRIPTION

Figure 1:
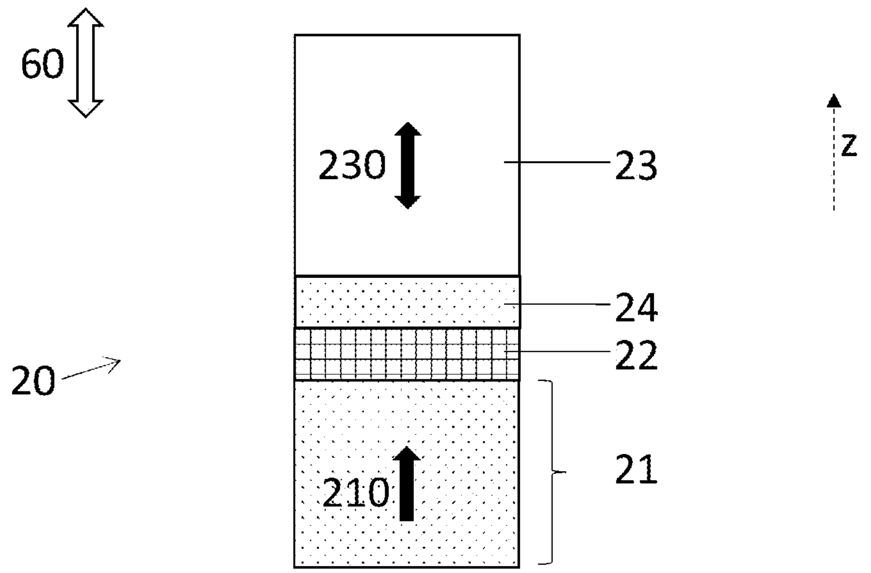
Fig. 1 (Prior art)
Figure 2:
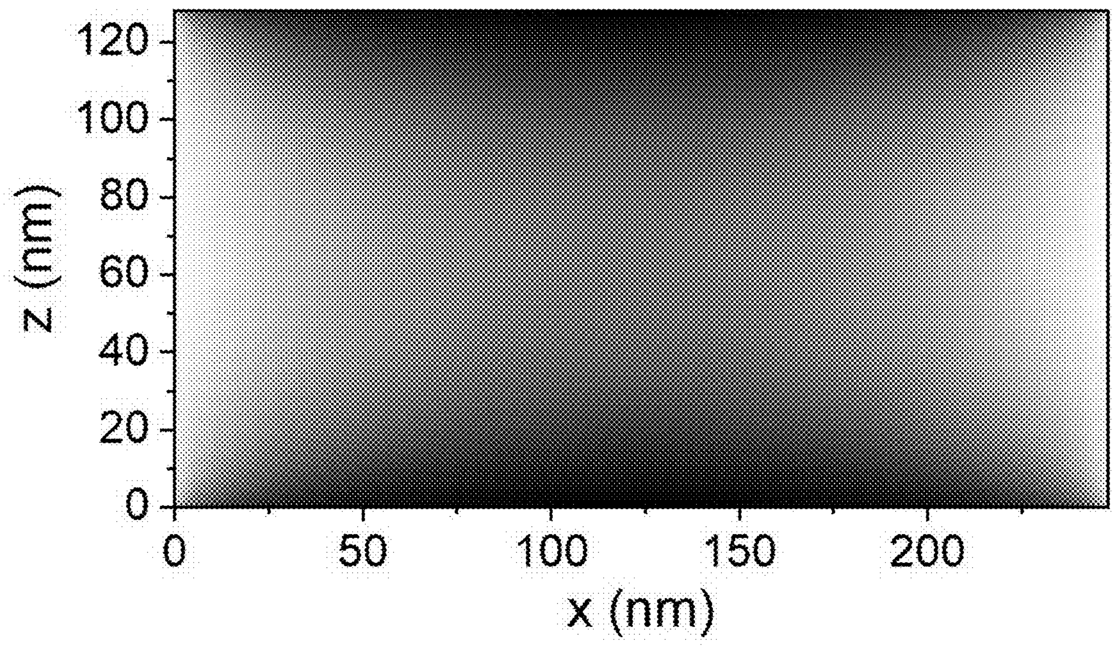
Fig. 2 (Prior art)
Figure 3:
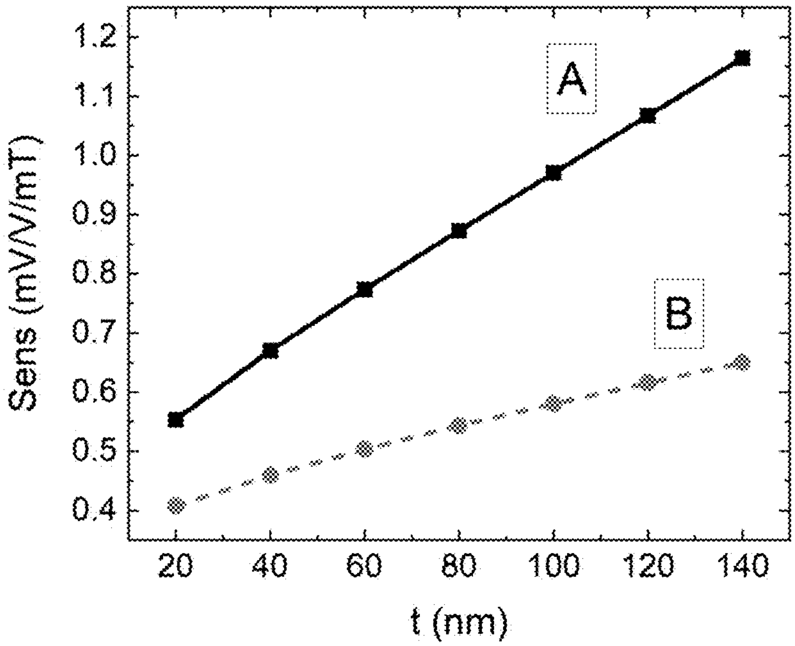
Fig. 3 (Prior art)
Figure 4:
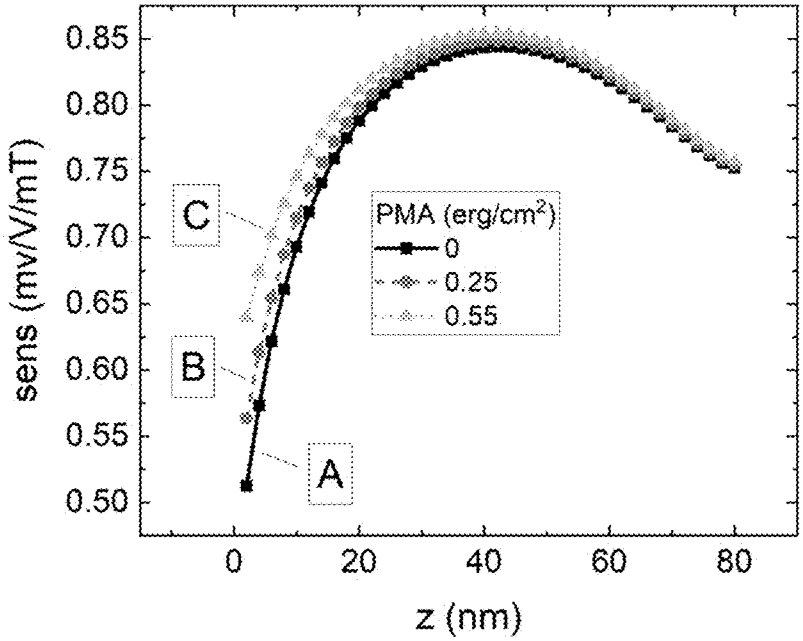
Fig. 4 (Prior art)
Figure 5:
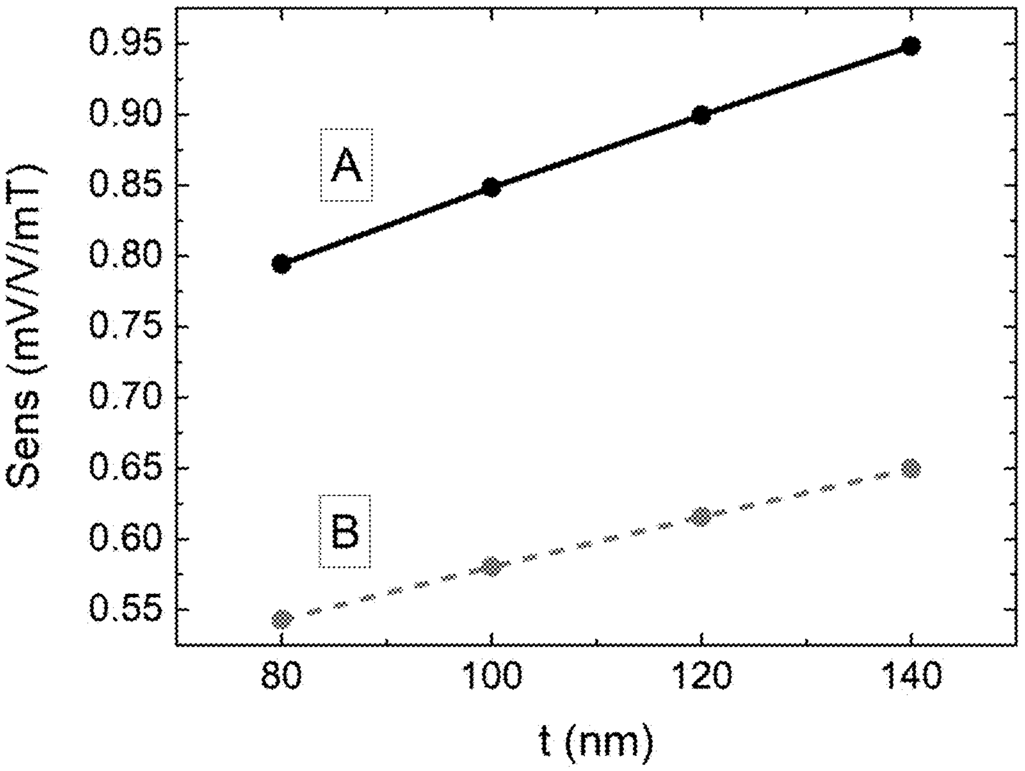
Fig. 5 (Prior art)
Figure 6A:
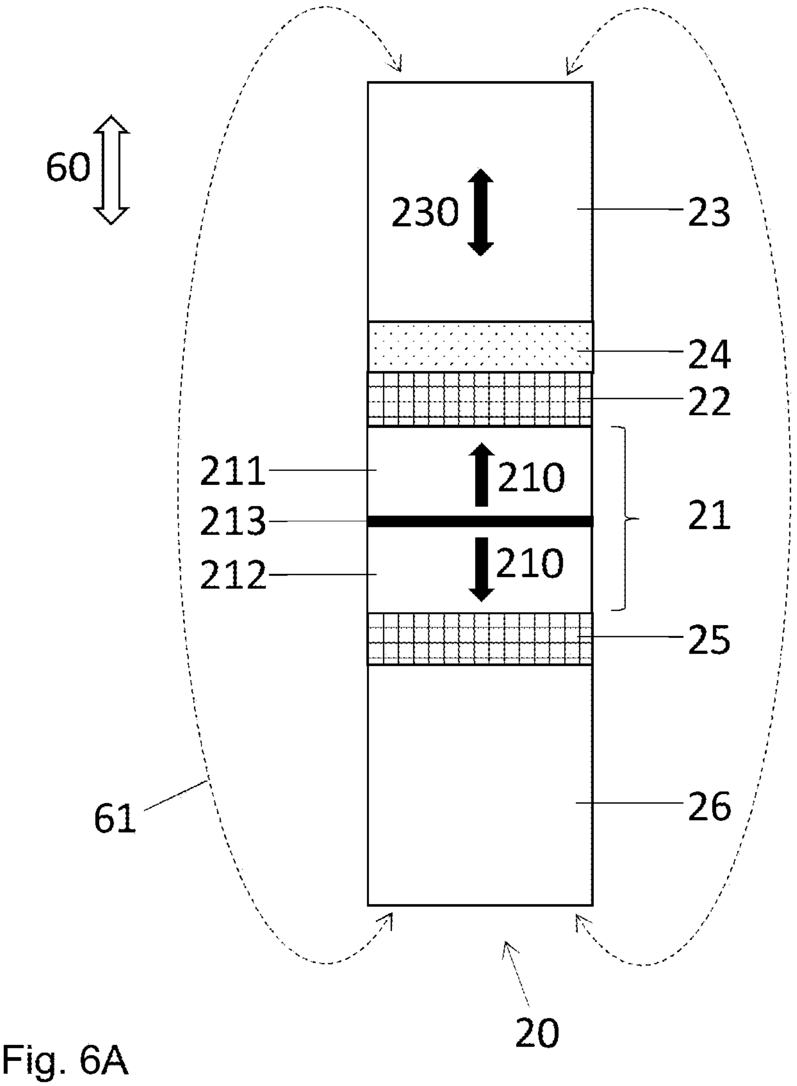
FIG. 6A represents a MR element comprising a sense layer and a dipolar assisting layer showing an external magnetic field and a dipolar assisting layer generating a stray magnetic field, according to an embodiment.

FIG. 6A shows a MR element 20 for sensing an external magnetic field in an out-of-plane direction, according to an embodiment. The MR element 20 corresponds to an out-of-plane magnetic sensing element or a Z-axis sensing magnetic element. The MR element 20 comprises a reference layer 21 having a reference magnetization 210, a sense layer 23 having a sense magnetization 230, and a tunnel barrier layer 22 between the reference layer 21 and the sense layer 23. The sense magnetization 230 comprises a vortex configuration stable under the presence of an external magnetic field 60. When the external magnetic field 60 varies in an out-of-plane direction, the vortex configuration of the sense magnetization 230 is reversibly movable in the out-of-plane direction, relative to the reference magnetization 210 that remains substantially fixed.

The reference and sense layers 21, 23 can include, or be formed of, a magnetic material and, in particular, a magnetic material of the ferromagnetic type.

More particularly, the reference layer 21 can comprise, or can be made of, a ferromagnetic alloy such as CoFe, NiFe or CoFeB. The reference layer 21 can comprise one or a plurality of ferromagnetic layers or a synthetic antiferromagnet (SAF). The reference layer 21 can have a thickness between 2 nm and 4 nm, but preferably of about 4 nm.

As illustrated in FIG. 6A, the reference layer 21 comprises a SAF structure including a first reference sublayer 211 in contact with the tunnel barrier layer 22 and a second reference sublayer 212 separated from the first reference sublayer 211 by a coupling layer 213. The coupling layer 213 antiferromagnetically couple the first reference sublayer 211 to the second reference sublayer 212 (RKKY coupling). Each of the first and second reference sublayer 211, 212 has a reference magnetization 210 that is oriented substantially perpendicular to the plane (out-of-plane, or in the z direction) of the first and second reference sublayer 211, 212. Due to the RKKY coupling, the reference magnetization 210 in the first and second reference sublayer 211, 212 are oriented in opposite directions. The first reference sublayer 211 can comprise, or be made of, a soft ferromagnetic material such as CoFe or CoFeB. The second reference sublayer 212 can comprise, or be made of, a hard ferromagnetic material. The coupling layer 213 can comprise a nonmagnetic material selected from a group comprising at least one of: ruthenium (Ru), chromium (Cr), rhenium (Re), iridium (Ir), rhodium (Rh), silver (Ag), copper (Cu), and yttrium (Y). The coupling layer 213 can have a thickness between about 0.4 nm and 3 nm.

The tunnel barrier layer 22 can comprise an insulating material. Suitable insulating materials include oxides, such as aluminum oxide (e.g., $Al_2O_3$) and magnesium oxide (e.g., MgO). The thickness of the tunnel barrier layer 22 can be in the nm range, such as from about 1 nm to about 3 nm. In a preferred embodiment, the tunnel barrier layer 22 is MgO, for example formed by sputter depositing a MgO target, or by depositing one or more Mg layers and then oxidizing one or more Mg layers with a known radical oxidation (ROX) or natural oxidation (NOX) method.

The sense layers 23 can comprise, or be made of, a soft ferromagnetic material, namely one having a relatively low coercivity. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fc10; and alloys based on Co, Fe, and B. In some instances, alloys based on Ni and Fe (and optionally B) can have a smaller coercivity than alloys based on Co and Fe (and optionally B). Preferably, the sense layers 23 comprises, or is made of, a NiFe alloy.

More particularly, the sense magnetization 230 is orientable in a direction out-of-plane, substantially perpendicular to the plane of the sense layer 23 (in the z direction). For instance, the sense magnetization 230 can have a perpendicular magnetic anisotropy. In this configuration, the vortex configuration of the sense magnetization 230 is reversibly movable in an out-of-plane direction when the external magnetic field 60 varies in an out-of-plane direction.

In one aspect, the MR element 20 can comprise an interface layer 24 between the sense layer 23 and the tunnel barrier layer 22. The interface layer 24 allows for increasing the TMR of the MR element 20 (TMR ratio equal or above than 100%). The interface layer 24 can comprise, or can be formed of, a CoFeB-based alloy.

For example, the interface of a MgO tunnel barrier layer 22 with the interface layer 24 comprising a CoFeB-based alloy provides higher interfacial perpendicular anisotropy and a greater magnitude of the perpendicular magnetic anisotropy in the magnetic layer compared to an interface with other metal oxides than MgO.

Figure 6B:
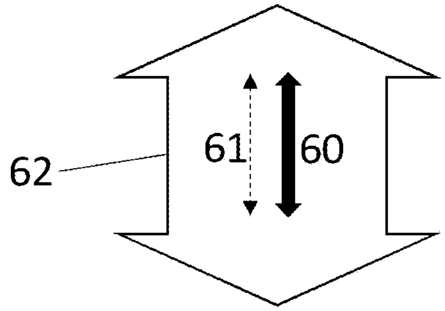
FIG. 6B shows a schematic representation of an effective magnetic field comprising the sum of the external magnetic field and the stray magnetic field.

In an embodiment, the MR element 20 further comprises a dipolar assisting layer 26. The dipolar assisting layer 26 is configured to generate a dipolar stray field 61 oriented substantially out-of-plane (z direction, see FIG. 6A). The stray magnetic field 61 is added to the out-of-plane external magnetic field 60, resulting in an effective magnetic field 62 that is larger than and proportional to the external magnetic field 60. FIG. 6B shows a schematic representation of the effective magnetic field 62 comprising the sum of the external magnetic field 60 and the stray magnetic field 61. In other words, the dipolar assisting layer 26 acts as an amplifier on the external magnetic field 60. The sense layer 23 sees the larger effective magnetic field 62 and the out-of-plane sensitivity S of the MR element 20 is increased. Another possible way of considering the effect of the dipolar assisting layer 26 is that the stray magnetic field 61 at least partially cancels the demagnetizing field at the bottom part of sense layer 23.

The dipolar assisting layer 26 can comprise, or can be formed of, a material having perpendicular magnetic anisotropy (bulk perpendicular magnetic anisotropy). The material can further have high magnetization saturation.

In one aspect, the dipolar assisting layer 26 comprises, or is formed of, a Co/Ni multilayer or a CoNi-based alloy. Alternatively, the material can comprise an alloy based on any one of, alone or in combination, Co, Ni, Fe, platinum (Pt), tantalum (Ta), palladium (Pd), tungsten (W), Ru, Ir, Cr, terbium (Tb), gadolinium (Gd), or samarium (Sm). The thickness of the dipolar assisting layer 26 can be between 10 and 200 nm.

The sense layer 23 further has an out-of-plane sense magnetic susceptibility $\chi_{24}$. The out-of-plane sense magnetic susceptibility $\chi_{24}$ corresponds to the slope of the linear region of the M(H) loop as described by equation 1:

$$\chi=\partial M/\partial H_{ext} \quad \text{Eq. 1}$$

The out-of-plane sensitivity S of the MR element 20 is proportional to the product between the out-of-plane sense magnetic susceptibility $\chi_{24}$ and the tunnel magnetoresistance (TMR) of the MR element 20 as described by equation 2:

$$S=\chi_{24}*\mathrm{TMR}/(Ms*(2+\mathrm{TMR})), \quad \text{Eq. 2}$$

where Ms is the saturation magnetization of the materials forming the sense layer.

In one aspect, the dipolar assisting layer 26 has an out-of-plane dipolar magnetic susceptibility $\chi_{26}$ that is larger than the out-of-plane sense magnetic susceptibility $\chi_{24}$. This allows for obtaining a larger dipolar stray field 61 which assists the external magnetic field 60 to magnetize the sense layer 23.

In a preferred embodiment, the dipolar assisting layer 26 is arranged at one end of the MR element opposed to the sense layer 23. In other words, the dipolar assisting layer 26 is arranged such that the reference layer 21 is between the tunnel barrier layer 22 and the dipolar assisting layer 26.

In an embodiment, the MR element 20 further comprise a non-magnetic spacer layer 25 between the reference layer 21 and the dipolar assisting layer 26. The non-magnetic spacer layer 25 can be made of a conductive material such as one or more of Cu, Al, W, Cr, Ta, Ru, Pt, and Pd, and has a thickness that is sufficient to prevent exchange coupling between the reference layer 21 and the dipolar assisting layer 26. For instance, the non-magnetic spacer layer 25 can have a thickness between 1 nm and 50 nm.

In one aspect the MR element 20 comprises the sense layer 23, and the tunnel barrier layer 22, the interface layer 24, the tunnel barrier layer 22, the reference layer 21, the non-magnetic spacer layer 25 and the dipolar assisting layer 26 arranged in this order.

Increasing the thickness of the dipolar assisting layer 26 increases the out-of-plane sensitivity S of the MR element 20. FIG. 7 reports the normalized relative conductance of the MR element 20 as a function of the external magnetic field, for the MR element 20 comprising the dipolar assisting layer 26, 60 nm in thickness, the interface layer 24, and the sense layer 23 having a thickness of 20 nm (curve A), 40 nm (curve B), 60 nm (curve A), and 80 nm (curve D). FIG. 7 also reports the normalized relative conductance of the MR element 20 as a function of the external magnetic field, for the MR element 20 without the dipolar assisting layer 26, 60 nm in thickness, and with the interface layer 24, and the sense layer 23 having a thickness of 80 nm (curve E), 100 nm (curve F), 120 nm (curve G), and 140 nm (curve H). In this example, the interface layer 24 is formed of a CoFeB-based alloy. The slope of the normalized relative conductance as a function of the external magnetic field corresponds to the out-of-plane sensitivity S of the MR element 20. Thus, FIG. 7 shows that the out-of-plane sensitivity S of the MR element 20 increases when the MR element 20 comprises the dipolar assisting layer 26 and with increasing thickness of the sense layer 23.

FIG. 8 reports the out-of-plane sensitivity S of the MR element 20 as a function of the thickness of the sense layer 23, for different thicknesses of the dipolar assisting layer 26. FIG. 9 shows that the out-of-plane sensitivity S of the MR element 20 increases when the thickness of the dipolar assisting layer 26 is increased from 0 nm to 60 nm for the sense layer 23 having a thickness between 20 nm and 80 nm. The out-of-plane sensitivity S is increased by about 21%, 37%, and 52% for the dipolar assisting layer 26 having a thickness of 20 nm (curve A), 40 nm (curve B), and 60 nm (curve C), respectively, relative to the out-of-plane sensitivity S for the sense layer 23 in the absence of the dipolar assisting layer 26 (curve D).

FIG. 9 reports the out-of-plane sensitivity S of the MR element 20 as a function of the sum of the thickness of the sense layer 23 and the thickness of the dipolar assisting layer 26, for different thicknesses of the dipolar assisting layer 26. Curve A shows the case where the dipolar assisting layer 26 has a thickness of 20 nm and where the thickness of the sense layer 23 is varied from 60 nm to 120 nm, such that the ratio of the sense layer 23 thickness to the dipolar assisting layer 26 thickness is always greater than 1. Curve B shows the case where the dipolar assisting layer 26 has a thickness of 40 nm and where the thickness of the sense layer 23 is varied from 40 nm to 100 nm such that the ratio of the sense layer 23 thickness to the dipolar assisting layer 26 thickness varies from 1 to 3.5. Curve C shows the case where the dipolar assisting layer 26 has a thickness of 60 nm and where the thicknesses of the sense layer 23 is varied from 20 nm to 80 nm such that the ratio of the sense layer 23 thickness to the dipolar assisting layer 26 thickness varies from 0.33 to 2.33. Curve C shows that the out-of-plane sensitivity S diminishes for a ratio of the sense layer 23 thickness to the dipolar assisting layer 26 thickness that is below 1.

FIG. 9 shows that the out-of-plane sensitivity S of the MR element 20 can be further increased when the sense layer 23 has a thickness that is larger than the thickness of the dipolar assisting layer 26.

The MR element 20 can have a shape including cylindrical, elliptical, polygonal, non-centrosymmetric, or ring shaped. The MR element 20 can have a lateral size between 50 nm and 1000 nm. The MR element 20 can have an aspect ratio of its thickness to diameter between 0.1 and 3.

The present disclosure further concerns a magnetic sensor device comprising the MR element 20 (not shown). The magnetic sensor device can comprise a plurality of the MR element 20. The plurality of the MR element 20 can be arranged in a half bridge or full bridge configuration, such as a Wheatstone bridge configuration.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. Magnetoresistive sensor (MR) element, comprising
- a reference layer having a reference magnetization;
- a sense layer having a sense magnetization comprising a vortex configuration stable under the presence of an external magnetic field, the sense magnetization being reversibly movable in a direction out-of-plane relative to the reference magnetization when the external magnetic field varies in a direction out-of-plane;
- a tunnel barrier layer between the reference layer and the sense layer;
- a dipolar assisting layer, configured to generate a dipolar stray field oriented substantially out-of-plane, such that the dipolar stray field is added to the out-of-plane external magnetic field, resulting in an effective magnetic field that is larger than and proportional to the external magnetic field,
- wherein the sense layer has an out-of-plane sense magnetic susceptibility; and wherein the dipolar assisting layer has an out-of-plane dipolar magnetic susceptibility that is larger than that the out-of-plane sense magnetic susceptibility.

2. The MR element according to claim 1,
wherein the dipolar assisting layer comprises, or is formed of, a material having a perpendicular magnetic anisotropy.

3. The MR element according to claim 1,
wherein the dipolar assisting layer comprises, or is formed of, a Co/Ni multilayer or a CoNi-based alloy.

4. The MR element according to claim 1,
wherein the dipolar assisting layer comprises any one of, alone or in combination, Co, Ni, Fe, Pt, Ta, Pd, W, Ru, Ir, Cr, Tb, Gd, or Sm.

5. The MR element according to claim 1,
wherein a dipolar assisting layer arranged such that the reference layer is between the tunnel barrier layer and the dipolar assisting layer.

6. The MR element according to claim 1,
wherein the dipolar assisting layer comprises, or is formed of, a material having perpendicular magnetic anisotropy.

7. The MR element according to claim 1,
wherein the dipolar assisting layer comprises, or is formed of, a Co/Ni multilayer or a CoNi-based alloy.

8. The MR element according to claim 1,
wherein the dipolar assisting layer comprises an alloy based on any one of, alone or in combination, Co, Ni, Fe, Pt, Ta, Pd, W, Ru, Ir, Cr, Tb, Gd, or Sm.

9. The MR element according to claim 1,
wherein the thickness of the dipolar assisting layer is between 10 and 200 nm.

10. The MR element according to claim 1,
wherein the dipolar assisting layer has a thickness that is equal or larger than the thickness of the sense layer.

11. The MR element according to claim 1,
further comprising an interface layer between the sense layer and the tunnel barrier layer and configured to increase the perpendicular magnetic anisotropy of the sense layer.

12. The MR element according to claim 11,
wherein the interface layer comprises, or is formed of, a CoFeB-based alloy.

13. The MR element according to claim 1,
wherein the MR element has a lateral size between 50 nm and 1000 nm.

14. The MR element according to claim 13,
wherein the MR element has an aspect ratio of its thickness to diameter between 0.1 and 3.

15. Magnetoresistive sensor (MR) element, comprising:
- a reference layer having a reference magnetization;
- a sense layer having a sense magnetization comprising a vortex configuration stable under the presence of an external magnetic field, the sense magnetization being reversibly movable in a direction out-of-plane relative to the reference magnetization when the external magnetic field varies in a direction out-of-plane;
- a tunnel barrier layer between the reference layer and the sense layer;
  - a dipolar assisting layer, configured to generate a dipolar stray field oriented substantially out-of-plane, such that the dipolar stray field is added to the out-of-plane external magnetic field, resulting in an effective magnetic field that is larger than and proportional to the external magnetic field; and
- a non-magnetic spacer layer between the reference layer and the dipolar assisting layer and configured to prevent exchange coupling between the reference layer and the dipolar assisting layer,
  - wherein the non-magnetic spacer layer has a thickness between 1 nm and 50 nm.

16. The MR element according to claim 15, wherein the dipolar assisting layer comprises a material having a perpendicular magnetic anisotropy.

17. The MR element according to claim 15, wherein the reference layer is between the tunnel barrier layer and the dipolar assisting layer.

18. The MR element according to claim 15, wherein a thickness of the dipolar assisting layer is between 10 and 200 nm.

19. The MR element according to claim 15, wherein the dipolar assisting layer has a thickness that is equal or larger than the thickness of the sense layer.

20. The MR element according to claim 15, further comprising an interface layer between the sense layer and the tunnel barrier layer and configured to increase the perpendicular magnetic anisotropy of the sense layer.

* * * * *